United States Patent [19]

Egawa

[11] Patent Number: 4,876,689
[45] Date of Patent: Oct. 24, 1989

[54] OUTPUT VOLTAGE DETECTING DEVICE IN A LASER OSCILLATOR

[75] Inventor: Akira Egawa, Minamitsura, Japan

[73] Assignee: Fanuc Ltd., Minamitsuru, Japan

[21] Appl. No.: 269,743

[22] PCT Filed: Feb. 19, 1988

[86] PCT No.: PCT/JP88/00183
§ 371 Date: Oct. 27, 1988
§ 102(e) Date: Oct. 27, 1988

[87] PCT Pub. No.: WO88/06810
PCT Pub. Date: Sep. 7, 1988

[30] Foreign Application Priority Data

Mar. 3, 1987 [JP] Japan .................................. 62-48410
Mar. 3, 1987 [JP] Japan .................................. 62-48411
Mar. 3, 1987 [JP] Japan .................................. 62-48412

[51] Int. Cl.$^4$ ................................................ H01S 3/00
[52] U.S. Cl. ........................................ 372/38; 372/21
[58] Field of Search ...................... 372/38, 69; 378/55, 378/81, 82

[56] References Cited

U.S. PATENT DOCUMENTS 4,823,350 4/1989 Tamazaki .............................. 372/38

Primary Examiner—Leon Scott, Jr.
Attorney, Agent, or Firm—Staas & Halsey

[57] ABSTRACT

An output voltage detecting device in a laser oscillator, in which laser oscillation is performed by applying a high frequency voltage to a laser tube. The device includes a voltage detection circuit connected to an input of an inverter which applies the high frequency voltage. The voltage detection circuit includes a nonlinear element to which a reference voltage is set, and a current transformer for detecting a current flowing in the nonlinear element. An abnormality in an output voltage is detected from a current flowing in the nonlinear element.

15 Claims, 4 Drawing Sheets

OUTPUT VOLTAGE DETECTING DEVICE IN A LASER OSCILLATOR

BACKGROUND OF THE INVENTION

The present invention relates to an output voltage detecting device in a laser oscillator, and more particularly to an output voltage detecting device in a laser oscillator, in which an output voltage can be detected with a circuit having a simple configuration.

A laser tube for use in a gas laser device has an electrical impedance which varies depending upon an interiorly confined gas status. As a consequence, a voltage supplied to the laser tube varies. For example, in a laser oscillator having a current feedback loop with which a current is fedback to the laser tube, the variation in the electrical impedance of the laser tube causes the supply voltage to vary since the current is being controlled to be constant. If this condition remains semiconductor elements, the laser tube or other elements forming an inverter are damaged.

In view of the foregoing, it is a conventional practice to detect the voltage supplied to the laser tube. When the resultant voltage is above a reference voltage, an alarm is generated. When the detected voltage is above a danger-level voltage, the driving is stopped. In addition, it has been necessary to detect and monitor the output voltage in order to control the output voltage to be constant.

However, when a transformer is used, it is required to have a considerably high voltage insulation resistivity. The transformer is further required to have a high frequency characteristic attendant to the high frequency power supply unit. For such reasons, the transformers which are extremely expensive have to be employed.

A method in which the voltage is divided by capacitors has a problem in that a power supply line led to the laser tube cannot be isolated from a ground connection of a control apparatus, so that noise is liable to be introduced into a control circuit.

SUMMARY OF THE INVENTION

An object of the present invention is to resolve the foregoing problems and to provide an output voltage detecting device in a laser oscillator, in which an output voltage is detected with a circuit having a simple configuration, and an abnormal voltage can be monitored.

Another object of the present invention is to provide an output voltage detecting device in a laser oscillator, which is operable at a low voltage and producible at a low cost.

In order to resolve the foregoing problems, the present invention provides an output voltage detecting device in a laser oscillator in which laser oscillation occurs upon application of a high frequency voltage to a laser tube. The device comprises a voltage detection circuit connected to an input of an inverter for applying the high frequency voltage. The voltage detecting circuit includes a nonlinear element and a reference voltage, and a current transformer for detecting a current flowing in the nonlinear element. An abnormality of the output voltage is detected in accordance with the current flowing in a nonlinear element.

The nonlinear element has a nonlinear point at a voltage slightly higher than a regular voltage of a converter, and a current vs. resistance characteristic is abruptly changed when the voltage applied thereto exceeds the nonlinear voltage point. Accordingly, when the output voltage of the converter exceeds the reference voltage, a current flows abruptly in the nonlinear element. Thus, upon detection of the current by means of the current transformer, an abnormal voltage is detected.

Details of other aspects of the invention will become apparent when read in conjunction with the later described embodiments and the accompanying drawings.

DESCRIPTION OF THE PREFERRED EMBODIMENTS

A first embodiment of the present invention will now be described with reference to the drawings.

Figure 1:
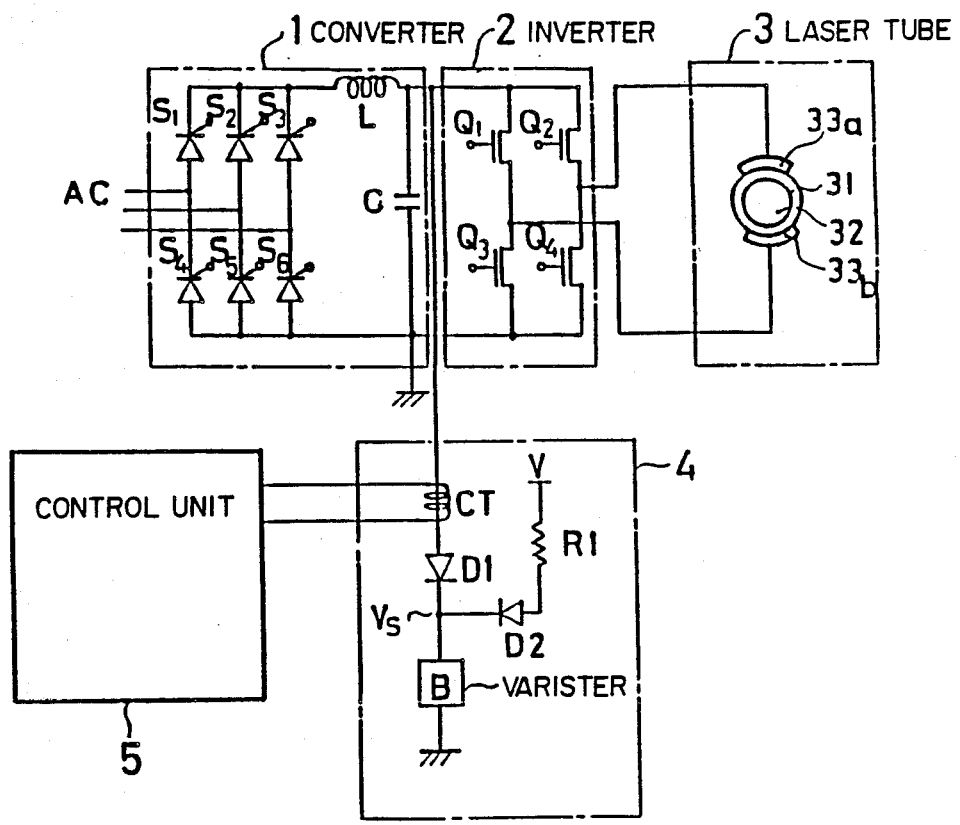
FIG. 1 is a block diagram of a first embodiment according to the present invention.

FIG. 1 is a block diagram of a first embodiment according to the present invention, in which a converter 1 converts a current from a commercial power supply to a D.C. current upon rectification. The converter comprises six SCRs S1 through S6.

An inverter 2 modulates the D.C. output voltage from the converter 1 to a high frequency voltage at several megahertz. The inverter is in the form of a bridge circuit composed of four FETs.

A laser tube 3 includes a tube 31 formed, for example, with silica glass, in the interior of which a laser medium gas 32 is circulated, and electrodes 33a and 33b apply the high frequency voltage to the tube 31. A discharge occurs by applying the high frequency voltage to the laser medium gas 32 confined within the tube 31, whereby the laser light is oscillated and amplified. The direction in which the laser light is emitted is perpendicular to the surface of the sheet of the drawing.

A current detection circuit 4 is connected to the output of the converter 1. The line extending from the converter 1 is coupled to a current transformer CT and is then connected to a diode D1. The diode D1 is connected to a varistor B which is a nonlinear element. An opposite terminal of the varistor B is connected to ground. The varistor is further connected to a diode D2, and the anode of the diode D2 is connected through a resistor R1 to a reference voltage V.

The reference voltage V is set 5 to 10% higher than a normal voltage of the converter 1. The varistor B as used has a nonlinear point, i.e. a point in which a resistance characteristic varies, higher by 10 volts or so than the reference voltage. Accordingly, the voltage VS depicted in the figure is lower than the nonlinear point of the varistor B when the output voltage of the converter 1 is normal, in which case a little current flows in the diode D1.

However, as the voltage of the converter 1 increases and when it exceeds the nonlinear point of the varistor B, a current flows abruptly in the diode D1. The current flowing therein is detected by the current transformer CT.

A control unit 5 detects an abnormal voltage responsive to a rising edge of the current flowing in the current transformer CT, whereupon an alarm is generated.

When the detected voltage exceeds a danger-level voltage, the gate signals of the thyristors in the converter 1 are turned off to thereby stop driving.

Figure 2:
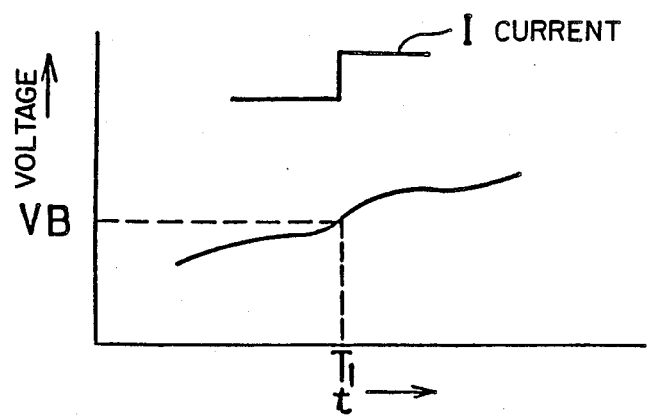
FIG. 2 is a graph of the relationship between a voltage and a current of a varistor B.

In FIG. 2, the graph depicts the relationship between the output voltage and the current of the converter 1. In FIG. 2, the ordinate represents the voltage VS in FIG. 1 and the abscissa represents time. When the voltage VS varies as illustrated in FIG. 2 and when it exceeds the nonlinear point VB of the varistor B at the time T1, the current I abruptly flows in the varistor B. The current flowing therein can be detected by the current transformer CT.

The abnormal voltage can thus be detected with a circuit having a simple configuration and the semiconductor elements including FETs in the inverter 2 can be protected. Further, since the ground-connected terminals of the converter 1 and the inverter 2 are not connected to the current transformer CT, there is little possibility that noise is introduced into the control unit 5.

In the foregoing description, the varistor has been exemplified as a nonlinear element, other kinds of nonlinear elements, such as a Zenor diode operable at a high voltage, can also be employed.

As described, according to the present invention, with the use of the nonlinear element for detecting the abnormal voltage, the variation in the current level is detected. Therefore, the abnormal voltage can be detected with a circuit having a simple configuration. In addition, it is capable of reducing the possibility that noise is introduced into the circuits of the control unit.

Next, a second embodiment will be described.

Figure 3:
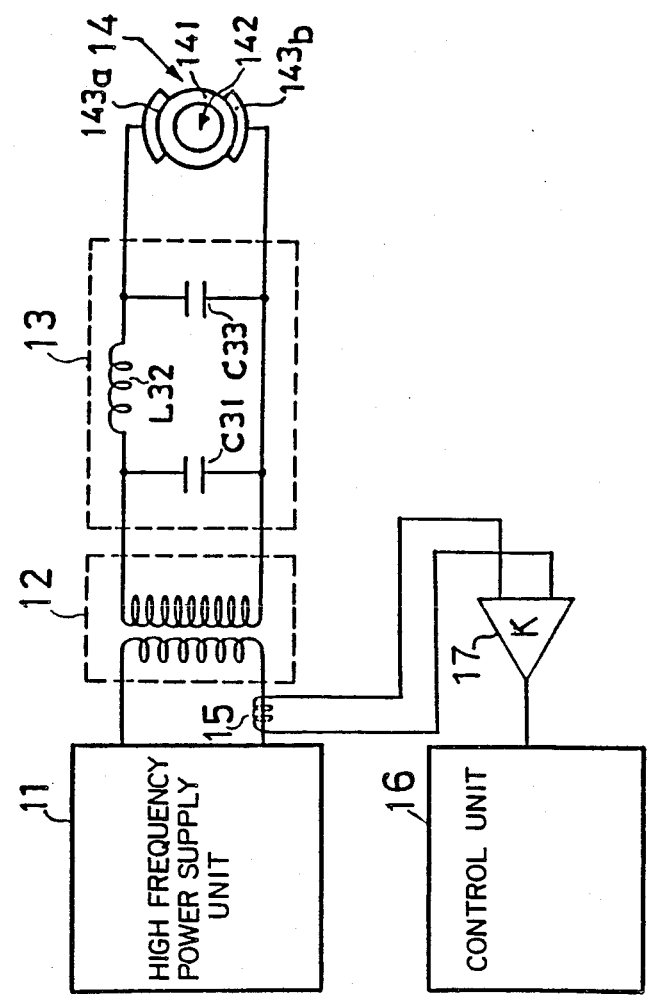
FIG. 3 is a block diagram of a second embodiment according to the present invention.

FIG. 3 is a block diagram of a second embodiment according to the present invention. In the figure, a high frequency power supply unit 11 supplies a high frequency voltage upon rectifying a current from a commercial power supply to provide a D.C. current and then converts it to a high frequency voltage using a high frequency inverter. A booster transformer 12 boosts the high frequency voltage supplied from the high frequency power supply unit 11 to a required voltage. A matching circuit 13 performs an impedance matching between the booster transformer 12 and a laser tube, so that power fed from the high frequency power supply unit 11 is effectively supplied to the laser tube. In this embodiment, a $\pi$-type matching circuit is employed. Capacitors C31 and C33 are parallel-connected reactances and an inductor L32 is a serially-connected reactance.

The laser tube 14 has a tube 141 formed with, for example, a silica glass. In the interior of the laser tube, a laser medium gas 142 is being circulated. Through electrodes 143a and 143b, a high frequency voltage is applied to the tube 141. A discharge occurs for the laser medium gas 142 confined within the laser tube 141 while applying a high frequency voltage, whereupon the laser light is oscillated and amplified. The direction in which the laser light is emitted is perpendicular to the sheet of the drawing.

A current transformer 15 is coupled to the ground-connected terminal of a primary winding of the booster transformer 12. Accordingly, the voltage induced in the current transformer 15 is extremely low, and thus current transformers of low insulation voltage are available. Since a ground terminal of the current transformer 15 is isolated from a power line for the laser discharge, there is little possibility that noise is introduced into the current transformer.

An amplifier 17 is provided in which, assuming that its amplification factor K is an impedance of the primary winding impedance of the transformer, the output of the amplifier 17 is defined by a product of a current fed from the current transformer 15 and an impedance of the primary winding of the booster transformer 12. A voltage of the high frequency power supply unit 11 is thereby calculated. Alternatively, dispensing with the amplifier 17, the voltage supplied to the laser tube 14 can be calculated in a control circuit 16 in such a manner that the current fed from the current transformer 15 is converted to a digital value with the use of a D/A converter and a product of the resultant value and the impedance of the primary winding of the transformer is obtained. The impedance of the primary winding of the booster transformer 12 has been stored in advance in the form of a digital value. The FETs used in the high frequency power supply unit 11 can be protected because of the detection voltage.

The voltage thus obtained is compared with a predetermined reference voltage, and when it is above the reference voltage by a predetermined value, an alarm is generated. When the voltage obtained has reached or is above a danger-level voltage, the driving is stopped. Furthermore, while monitoring the voltage obtained, it may automatically be controlled to be constant.

In the above description, although the current transformer is coupled to the primary winding of the transformer, it is possible to modify the transformer 12 to have three windings while dispensing with a special current transformer.

As described, according to this invention, since the output voltage of the high frequency power supply unit is detected on the basis of the current detected by the current transformer provided in the ground terminal of the primary winding of the transformer, current transformers having low insulation volltages and low cost are available. In addition, the output voltage of the high frequency power supply unit can be measured with a circuit having a simple configuration.

Figure 4:
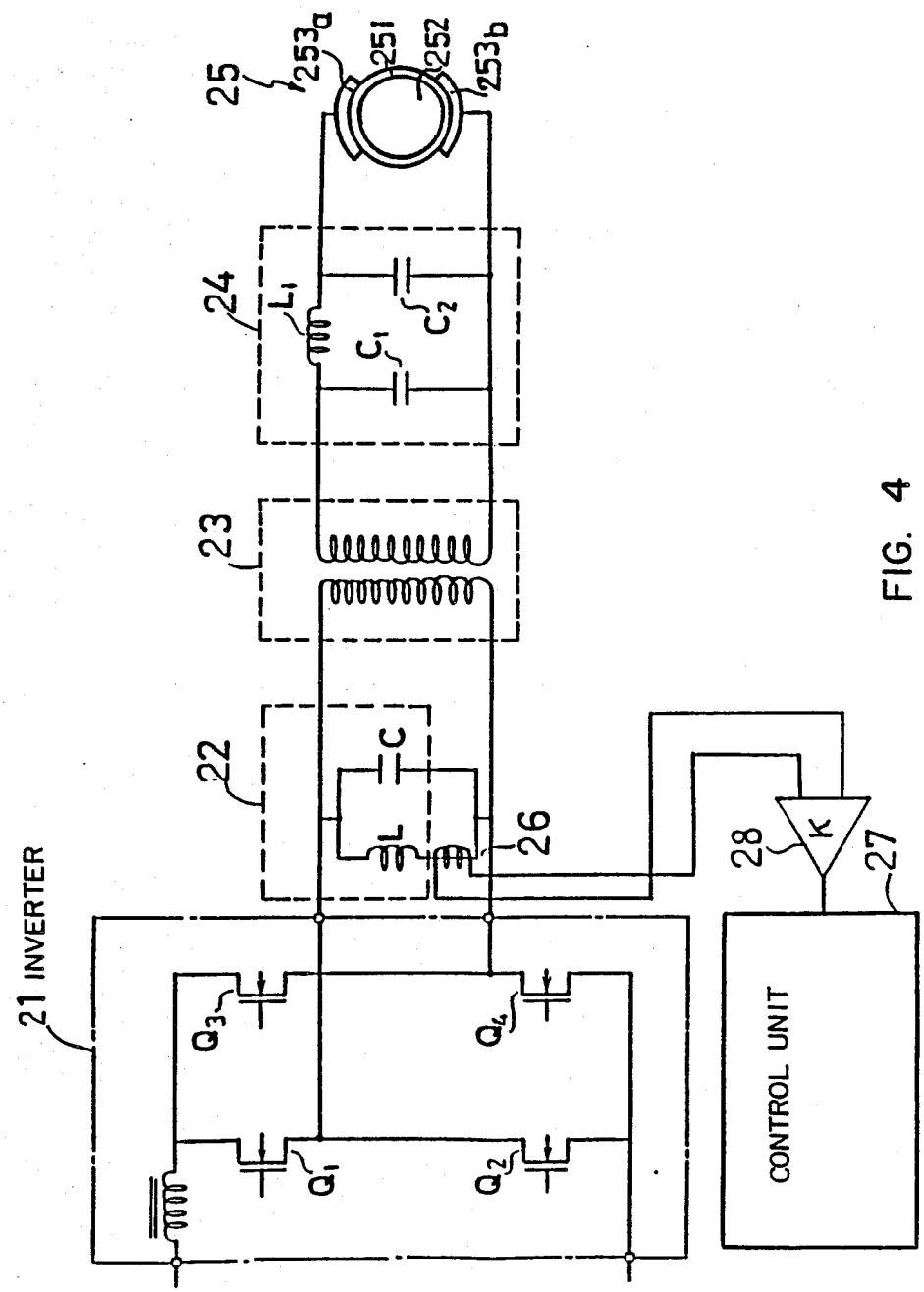
FIG. 4 is a block diagram of a third embodiment according to the present invention.

Next, a third embodiment will be described. FIG. 4 is a block diagram of an embodiment of the present invention. In FIG. 4, an inverter 21 rectifies a current from a commercial power supply to provide a D.C. current and then converts it to the high frequency voltage. A tank circuit 22 is connected in parallel to the output of the inverter 21, and is made up of a coil L and a capacitor C connected in parallel to each other. The tank circuit has a high sharpness of resonance Q, in which the coil L and the capacitor C are selected so that the impedance of the tank circuit 22 as viewed from the side of the inverter 21 is substantially purely resistive. A booster transformer 23 boosts the high frequency voltage supplied from the inverter 21 to a required voltage. A matching circuit 24 performs an impedance matching between the transformer 23 and a laser tube 26, so that power fed from the inverter 21 is effectively supplied to the laser tube. In this embodiment, a $\pi$-type matching circuit is employed. Capacitors C1 and C2 are parallel-connected reactances and an inductor L1 is a serially-connected reactance.

The laser tube 25 has a tube 251 formed with, for example, a silica glass. In the interior of the laser tube, a laser medium gas 252 is being circulated. Through electrodes 253a and 253b, a high frequency voltage is applied to the tube 251. A discharge takes place for the laser medium gas 242 confined within the laser tube 251 while applying a high frequency voltage, whereupon the laser light is oscillated and amplified. The direction in which the laser light is emitted is perpendicular to the sheet of the drawing.

A current transformer 26 is coupled to the ground-connected terminal of the coil L of the tank circuit. Accordingly, the voltage induced in the current transformer 26 is extremely low, and thus current transformers of low insulation voltage are available. Since a ground terminal of the current transformer 26 is isolated from a power line for the laser discharge, there is little possibility that noises are introduced into the current transformer.

An amplifier 28 is provided in which assuming that its amplification factor K is an impedance of the coil L, the output of the amplifier is defined by a product of a current fed from the current transformer 26 and an impedance of the coil L. A voltage of the high frequency power supply unit is thereby calculated. Alternatively, dispensing with the amplifier 28, the voltage supplied to the laser tube can be calculated in a control circuit 27 in such a manner that the current fed from the current transformer 26 is converted to a digital value with the use of a DA converter and a product of the resultant value and the impedance of the coil L of the tank circuit is obtained. The impedance of the coil L of the tank circuit 2 has been stored in advance in the form of a digital value. The FETs used in the inverter 21 can be protected due to the detection voltage. The voltage thus obtained is compared with a predetermined reference voltage, and when it is above the reference voltage by a predetermined value, an alarm is generated. When the voltage obtained has reached or is above a danger-level voltage, the driving is stopped. Furthermore, while monitoring the voltage obtained, it may automatically be controlled to be constant.

As described above, according to this embodiment, the voltage is detected from the current detected by the current transformer provided in the ground terminal of the coil in the tank circuit, current transformers having low insulation voltage and low cost are available. In addition, the output voltage from the high frequency power supply unit can be measured with a circuit having a simple configuration.

In the above description, although the current transformer is coupled to the ground terminal of the coil L, it is possible to modify the coil L to have an auxiliary winding (secondary winding) in which the output voltage from the power supply unit is detected from an output current of the auxiliary winding. Moreover, a similar effect can be obtained by an arrangement in which the current transformer is provided on the capacitor side of the tank circuit.

What is claimed is:

1. An output voltage detecting device in a laser oscillator, a high frequency power voltage being supplied to a laser tube to perform laser oscillation, said output voltage detecting device comprising:
   an inverter for supplying the high frequency power voltage;
   a voltage detection circuit connected to an input of said inverter, said voltage detector circuit comprising:
      a non-linear element in which a reference voltage is set;
      a current transformer, connected to said non-linear element, for detecting a current flowing in said non-linear element, an abnormality of the output voltage being detected from the current flowing in said non-linear element.

2. An output voltage detecting device in a laser oscillator as recited in claim 1, wherein said nonlinear element comprises a varistor.

3. An output voltage detecting device in a laser oscillator, including a booster transformer connected between a high frequency power supply unit and a laser tube, said output voltage detecting device comprising:
   a current transformer, coupled to a ground terminal of a primary winding of the booster transformer, for detecting a current flowing in the booster transformer, an output voltage of the high frequency power supply unit being detected when the current flows in said current transformer.

4. An output voltage detecting device in a laser oscillator as recited in claim 3, further comprising an alarm connected to said current transformer, wherein when said output voltage is equal to or above a predetermined reference value said alarm is generated.

5. An output voltage detecting device in a laser oscillator as recited in claim 3, wherein when said output voltage is equal to or above a predetermined danger-level voltage, driving of said output voltage device is stopped.

6. An output voltage detecting device in a laser oscillator as recited in claim 3, wherein said output voltage is controlled to be constant while monitoring said output voltage.

7. An output voltage detecting device in a laser oscillator, including a tank circuit having a high sharpness of resonance Q and having an inductor therein, provided between an inverter for a high frequency power supply and a laser tube, said output voltage detecting device comprising:
   a current transformer, coupled to a ground terminal of the inductor included in the tank circuit, for detecting a current flowing therein, an output voltage of the inverter being detected from the current flowing in said current transformer.

8. An output voltage detecting device in a laser oscillator as recited in claim 7, further comprising an alarm coupled to said current transformer, wherein when said output voltage is equal to or above a predetermined reference value, the alarm is generated.

9. An output voltage detecting device in a laser oscillator as recited in claim 7, wherein when said output voltage is equal to or above a danger-level voltage, driving of said output voltage detecting device is stopped.

10. An output voltage detecting device in a laser oscillator as recited in claim 7, wherein said output voltage is controlled to be constant while monitoring said output voltage.

11. An output voltage detecting device in a laser oscillator, including a tank circuit having a high sharpness of resonance Q and having a coil therein, provided between an inverter for a high frequency power supply and a laser tube, said output voltage detecting device comprising:
   an auxiliary winding provided in the coil in the tank circuit, an output voltage of the inverter being detected when a current flows in said auxiliary winding.

12. An output voltage detecting device for a laser oscillator, comprising:

a high frequency power supply connected to the laser oscillator for providing a high frequency voltage for carrying out laser oscillation;

booster means including a coil having a primary winding, coupled to said high frequency power supply, for receiving and boosting the high frequency voltage from said high frequency power supply to a required voltage;

a matching circuit, connected between the laser oscillator and said booster means, for impedance matching the output from said booster means and a laser oscillator;

a current transformer coupled to the primary winding of said booster means; and control means, connected to said current transformer, for calculating the voltage supplied to the laser oscillator.

13. An output voltage detecting device according to claim 12, further comprising an amplifier connected between said current transformer and said control means.

14. An output voltage detecting device according to claim 13, further comprising a tank circuit connected to said booster transformer and coupled to said current transformer.

15. An output voltage detecting device according to claim 14, wherein said high frequency power supply includes an inverter for receiving and rectifying a current from a commercial power supply, providing DC current, and converting the DC current to a high frequency voltage.

* * * * *